United States Patent
Tsukamoto et al.

(10) Patent No.: US 7,122,881 B2
(45) Date of Patent: Oct. 17, 2006

(54) WIRING BOARD AND CIRCUIT MODULE

(75) Inventors: Sotaro Tsukamoto, Aichi (JP); Satoru Kuromiya, Gifu (JP); Nobuhiro Hanai, Aichi (JP); Masato Hayashida, Gifu (JP)

(73) Assignee: Sony Corporation, (JP)

( * ) Notice: Subject to any disclaimer, the term of this patent is extended or adjusted under 35 U.S.C. 154(b) by 96 days.

(21) Appl. No.: 10/807,195

(22) Filed: Mar. 24, 2004

(65) Prior Publication Data

US 2004/0245640 A1 Dec. 9, 2004

(30) Foreign Application Priority Data

Apr. 14, 2003 (JP) .......................... P2003-108544

(51) Int. Cl.
*H01L 23/552* (2006.01)
*H01L 39/00* (2006.01)
*H01L 29/00* (2006.01)

(52) U.S. Cl. ...................... 257/660; 257/662; 257/501; 257/508; 257/659

(58) Field of Classification Search ................ 257/713, 257/659, 660, 728, 781, 723, 508, 662
See application file for complete search history.

(56) References Cited

U.S. PATENT DOCUMENTS 5,639,989 A * 6/1997 Higgins, III ........... 174/35 MS
5,796,170 A * 8/1998 Marcantonio ............... 257/786

FOREIGN PATENT DOCUMENTS

JP         2001-077537        3/2001

* cited by examiner

*Primary Examiner*—Douglas W. Owens
*Assistant Examiner*—Samuel A. Gebremariam
(74) *Attorney, Agent, or Firm*—Rader, Fishman & Grauer PLLC; Ronald P. Kananen

(57) ABSTRACT

A wiring board houses a bare radio-frequency IC. Shield wiring films are provided above and below the IC. A plurality of shield interlayer-connection conductor films, i.e., shield via-holes, is provided so as to surround the IC. The shield wiring films and the shield interlayer-connection conductor films define a shield cage, which can electrostatically shield the IC. Thus, there is no need to attach a shield cap.

6 Claims, 3 Drawing Sheets

WIRING BOARD AND CIRCUIT MODULE

BACKGROUND OF THE INVENTION

1. Field of the Invention

The present invention relates to a wiring board that has a plurality of wiring films, which are provided between interlayer insulating films, and interlayer-connection conductor films, which extend through the interlayer insulating films and provide electrical connections between the wiring films at different layers, and that houses at least one bare semiconductor integrated circuit device. The present invention also relates to a circuit module having another semiconductor integrated circuit device and a passive component that are mounted on the wiring board.

2. Description of the Related Art

Wireless communication ICs (semiconductor integrated circuit devices) for transmitting/receiving high-frequency signals and ICs for processing high-speed digital signals are susceptible to noise radiated from the surroundings, and the ICs also can be radiation-noise generating sources relative to other devices.

Accordingly, in a conventional approach, such ICs are covered with conductive shield caps, which are connected to, for example, ground lines (i.e., are grounded), so as to be electrostatically shielded from other devices.

FIG. 1 illustrates a known example of a circuit module having a RF-IC (radio-frequency integrated circuit device), for example, for transmitting/receiving a high-frequency signal or for processing a high-speed digital signal. A shield cap is provided for the RF-IC to provide electrostatic shielding.

Reference character 101 indicates a wiring board, and 102 indicates interlayer insulating films, which are made of a synthetic resin. Reference character 103 indicates wiring films made of a conductor, such as copper. Reference character 104 indicates interlayer-connection conductor films, which extend through the interlayer insulating films 102 and which provide electrical connections between the wiring films provided at different layers. The interlayer-connection conductor films 104 are called via-holes, through-holes, or the like. The interlayer-connection conductor films 104 will hereinafter be referred to as "via-holes".

Reference character 105 indicates an IC, which is mounted on one surface of the wiring board 101. Reference character 106 indicates a passive component (e.g., a resistor, a capacitor, a balun circuit, a crystal oscillator, or a filter), which is mounted on the surface of the wiring board 101. Reference character 107 indicates a RF-IC for, for example, transmitting/receiving a high-frequency signal. As described above, a shield cap 108 is provided to electrostatically shield the top and the periphery (lateral sides) of the RF-IC 107. Needless to say, the shield cap 108 is connected to a shield potential-point of a ground line or the like.

According to such a high-frequency circuit module, the shield cap 108 can prevent ambient noise from penetrating the RF-IC 107 and also can prevent the RF-IC 107 from becoming a noise radiation source to other devices.

Japanese Unexamined Patent Application Publication No. 2001-77537 discloses an alternative technology for providing electrostatic shielding. In the technology, a housing space for housing a bare IC is provided inside a wiring board, and shield wiring films are provided above and below the housing space inside the wiring board and are connected to a ground line. Thus, the IC within the housing space is electrostatically shielded by the upper and lower shield wiring films.

The known technology shown in FIG. 1, however, requires the attachment of the shield cap 108 for covering the IC (e.g., an RF-IC) 107 to provide electrostatic shielding, thus posing a problem in that it is difficult to achieve miniaturization.

In particular, a great demand exists for miniaturization of mobile telephones, mobile electronic devices, and the like, so that a great requirement also exists for high-frequency modules and the like for use therein.

Thus, since the known technology shown in FIG. 1, which requires the attachment of the shield cap 108, has difficulty in fulfilling the demand for miniaturization, it has a considerable problem.

Further, since the attachment of the shield cap 108 requires time and cost, the known technology has difficulty in meeting a demand for cost reduction.

The shield cap 108 also has a disadvantage in that it cannot electrostatically shield the bottom-side of the IC 107.

On the other hand, according to the technology disclosed in Japanese Unexamined Patent Application Publication No. 2001-77537, there is no need to attach the shield cap 108. An IC, such as a RF-IC, is housed in a housing space within a wiring board and is electrostatically shielded by wiring films of the wiring board. Thus, the technology facilitates miniaturization. Further, since there is no need for a process for attaching such a cap, the technology reduces time and cost, compared to the known technology shown in FIG. 1.

Additionally, the technology disclosed in Japanese Unexamined Patent Application Publication No. 2001-77537 is also advantageous in that it electrostatically shields not only the top side but also the bottom side of the IC.

Japanese Unexamined Patent Application Publication No. 2001-77537, however, does not provide electrostatic shielding against noise penetrating the RF-IC 107 from its side surfaces, which therefore does not provide a sufficient electrostatic shielding effect.

SUMMARY OF THE INVENTION

The present invention has been made to overcome the above-described problems, and an object of the present invention is to allow housing of a bare IC, such as an IC for transmitting/receiving a high-frequency signal or an IC for processing a high-speed digital signal, in a wiring board with more secured electrostatic shielding without an increase in size, time, and cost.

A wiring board according to a first aspect of the present invention has shield wiring films provided above and below an internal, bare, semiconductor, integrated circuit device (IC) and further has a plurality of shield via-holes (shield through-holes) that surround the IC.

Thus, according to the wiring board, not only can the upper and lower sides of the bare IC be electrostatically shielded by the upper and lower shield wiring films, but also the side surfaces of the bare IC can be electrostatically shielded by the plurality of shield via-holes (or shield through-holes) that surround the IC.

Additionally, since there is no need to attach a shield cap, it is possible to enhance the electrostatic shielding effect without an increase in size, time, and cost.

According to a second aspect of the present invention, a bare IC is directly mounted on upper or lower shield wiring films. Other configurations are the same as those described above.

This arrangement can facilitate heat to be released from the RF-IC 8 device forming portion to a surface opposite to the surface of the device forming portion.

When a bare IC is completely shielded by a shield, there is a need to provide a notch (hole) since the IC has a portion to which the potential of a ground line cannot be adjacent. Further, electrodes of the IC need to be extracted to the outside of the shield.

Thus, it is necessary to provide a notch in the wiring film above/below the IC or to provide shield via-holes (or shield through-holes) with a certain spacing therebetween.

When the spacing, however, is larger than one half the wavelength λg of a main electromagnetic wave radiated during operation of the IC, a portion where the notch or the like is provided acts as a slit antenna to produce radiation.

Thus, when a notch or spacing is provided, the gap a between the upper and lower shield wiring boards is preferably set to less than λg/2. This can prevent such an unwanted radiation and also can eliminate the risk that the portion of the gap acts as a slit antenna to produce radiation.

A guide wavelength λg will now be described in detail. The electromagnetic wave spectrum of a bare IC is measured, and λg is the wavelength of the highest frequency component of considerable spurious noise (for example, image frequency noise and a harmonics of 20 dB or more, e.g., for an IC for wireless communication). Naturally, λg is a value that allows for an in-air compression due to the dielectric constant of a board (i.e., $\lambda g = \lambda o/\epsilon r)^{1/2}$, where λo indicates a guide wavelength in a vacuum and εr is the relative dielectric constant of a board).

A hole may be provided in the shield wiring film. This arrangement can prevent the potential of a shield potential-point of a ground line or the like from affecting characteristics of the bare IC.

Further, preferably, the diameter or the longitudinal side of the hole is shorter than λg/2, i.e., one half the wavelength λg of a magnetic wavelength to be prevented from radiating. This arrangement can eliminate the risk that the portion of the hole acts as a slit antenna to cause reflection.

The upper and lower wiring films and the plurality of via-holes defines a shield cage having a rectangular-parallelepiped inner space with height a, width b, and length c (a≦b≦c), and preferably the wavelength λg of a magnetic wavelength to be prevented from radiating satisfies the relationship $\lambda g > 2/[\{(1/b)^2 + (1/c)^2\}^{1/2}]$.

This arrangement can prevent $TE_{101}$ resonance, which is the basic mode of cavity resonance. The definitions of the height a, width b, and length c of the inner space of the shield cage are described in detail later with reference to FIGS. 2A, 2B, and 2C.

A third aspect of the present invention provides a circuit module that further includes another IC and a passive component.

Since an IC and a passive component are provided in addition to the bare IC described above, the circuit module can provide the same advantages as those of the wiring board of the present invention.

DESCRIPTION OF THE PREFERRED EMBODIMENTS

According to the present invention, in essence, a wiring board has a shield cage for electrostatically shielding a bare IC. The shield cage is constituted by shield wiring films, which are provided above and below the bare IC, and a plurality of shield via-holes, which extend through interlayer insulating films and which provide electrical connections between the shield wiring films. The bare IC may be directly mounted on either of the upper and lower shield wiring films. In such a case, the shield wiring film on which the bare IC is directly mounted serves as both a mounting portion and an electrostatic shielding portion.

A hole needs to be provided in the shield wiring film at the bare-IC device forming surface (obverse surface), that is, the upper shield wiring film when the bare-IC device forming surface of the shield wiring film is directed upward or the lower shield wiring film when the device forming surface is directed downward. This holds for a case in which a ground line exists in the vicinity of an active surface of the IC and the potential of the ground line affects, characteristics of the IC. In such a case, in order to prevent radiation, it is preferable to set the diameter or longitudinal side of the hole to less than λg/2, as described above.

Examples of an IC that is electrostatically shielded include a RF-IC for transmitting/receiving a high-frequency signal and a high-speed digital IC for processing a high-speed digital signal. The present invention, however, is applicable to any IC. The following preferred embodiments of the present invention will be described in conjunction with an example in which a RF-IC for transmitting/receiving a high-frequency signal is electrostatically shielded.

The present invention will now be described in detail in conjunction with the embodiments thereof.

Figure 2A:
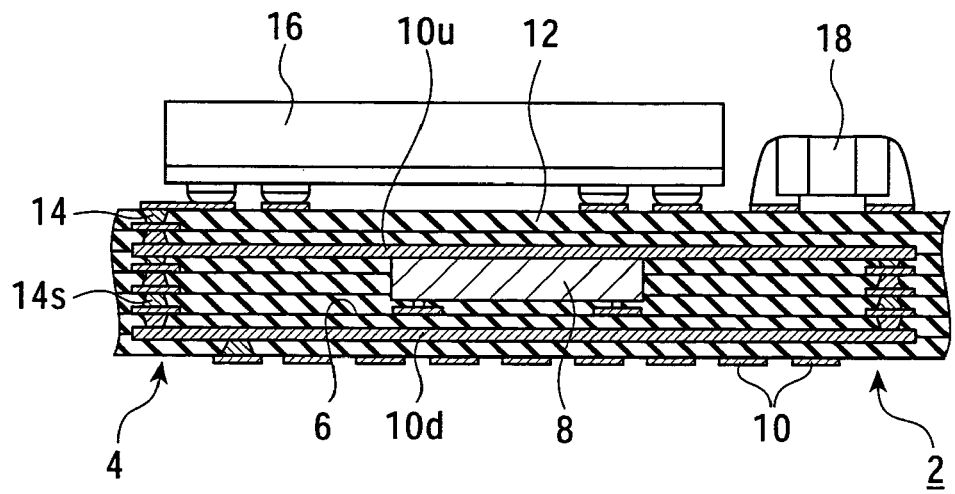
FIG. 2A is a cross-sectional view of a circuit module according to a first embodiment of the present invention.
Figure 2B:
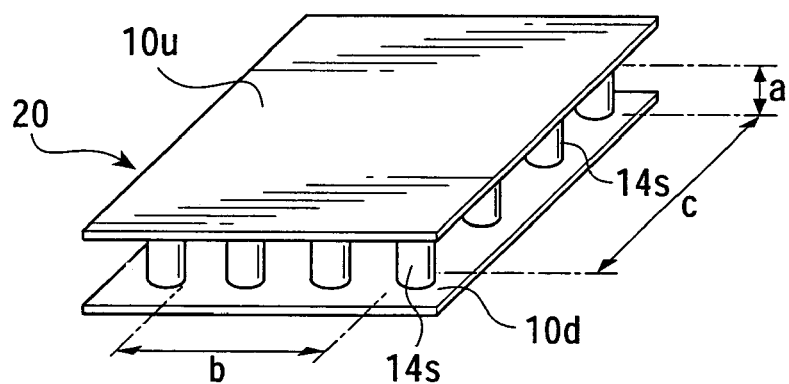
FIG. 2B is a perspective view showing a shield cage in a wiring board included in the circuit module and FIG. 2C is a plan sectional view of the shield cage.
Figure 2C:
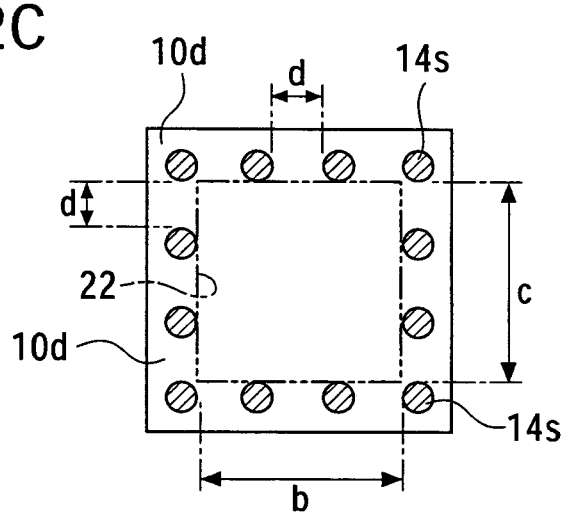

FIGS. 2A to 2C illustrate a circuit module according to a first embodiment of the present invention. Specifically, FIG. 2A is a cross-sectional view of the circuit module, FIG. 2B is a perspective view showing a shield cage in a wiring board included in the circuit module, and FIG. 2C is a plan sectional view of the shield cage.

In FIG. 2A, reference numeral 2 indicates a circuit module, for example, a small-power wireless communication module employing the Bluetooth ISM (Industrial, Scientific and Medical) band (2.4 GHz band), and reference numeral 4 indicates a wiring board. The wiring board 4 has an IC housing space 6, in which an RF-IC 8, such as an IC for a transceiver Modem, is housed.

Reference numeral 10 indicates wiring films for the wiring board 4. The wiring films 10 are made of metal, such as copper. Reference numeral 12 indicates an insulating layer, which is made of a resin. Reference numeral 14 indicates via-holes, which extend through interlayer insulating films and which provide electrical connections between the wiring films 10 provided at different layers.

Reference numeral 16 indicates an IC (e.g., a baseband IC serving as a control unit) that is mounted on one surface of the wiring board 4. Reference numeral 18 indicates a passive component (e.g., a resistor, capacitor, balun circuit, crystal oscillator, or filter) that is mounted on the surface of the wiring board 4.

In FIGS. 2B and 2C, reference numeral 20 indicates a shield cage for electrostatically shielding the RF-IC 8.

The shield cage 20 has an upper flat-plate shield wiring film 10u, a lower shield wiring film 10d, and shield via-holes 14s. The RF-IC 8 is mounted on the bottom surface of the upper shield wiring film 10u. The lower shield wiring film 10d is arranged below the RF-IC 8 so as to be in parallel with the upper shield wiring film 10u. The shield via-holes 14s are arranged between and adjacent to the sides of the upper shield wiring film 10u and the lower shield wiring film 10d to provide electrical connections therebetween.

Reference character d indicates spacing between the adjacent via-holes 14s. The shield cage 20 requires spacing, for example, for extracting electrodes of the RF-IC 8 to the outside, thus making it impossible to hermetically seal the RF-IC 8. In the present embodiment, the spacing between the adjacent via-holes 14s are used for extracting electrodes and the size of the spacing is indicated by d.

Reference character a indicates a gap between the upper shield wiring film 10u and the lower shield wiring film 10d, reference character b indicates a lateral side of an inner surface of the shield cage 20, and reference character c indicates a longitudinal side of the inner surface of the shield cage 20. In this case, the inner surface of the shield cage 20 refers to a portion 22 (indicated by a long dashed double-short dashed line shown in FIG. 2C) surrounded by all the shield via-holes 14s between the upper shield wiring film 10u and the lower wiring film 10d. The lateral side (width) is denoted by b, and the longitudinal side (length) is denoted by c.

Needless to say, the upper shield wiring film 10u, the lower shield wring film 10d, and the shield via-holes 14s, which constitute the shield cage 20, are connected to, for example, a ground line (i.e., are grounded).

The circuit module 2 can prevent the penetration of external noise, since the RF-IC 8 is electrostatically shielded by the shield cage 20.

Further, the circuit module 2 does not require the attachment of a shield cap, thus making it possible to enhance the electrostatic shielding effect without an increase in size, time, and cost.

Additionally, the circuit module 2 can facilitate heat to be released from the RF-IC 8 device forming portion to a surface opposite to the surface of the device forming portion, since the RF-IC 8 is directly mounted on the upper shield wiring film 10u.

It is preferable that the wavelength $\lambda g$ of an electromagnetic wave to be prevented from radiating satisfy the relationship $\lambda g > 2/[\{(1/b)^2 + (1/c)^2\}^{1/2}]$.

This is because such an arrangement can prevent $TE_{101}$ resonance, which is the basic mode of cavity resonance.

It is also preferable to set d (where d>a) to less than $\lambda g/2$ in order to prevent the shield cage 20 from functioning as a slit antenna.

Figure 3A:
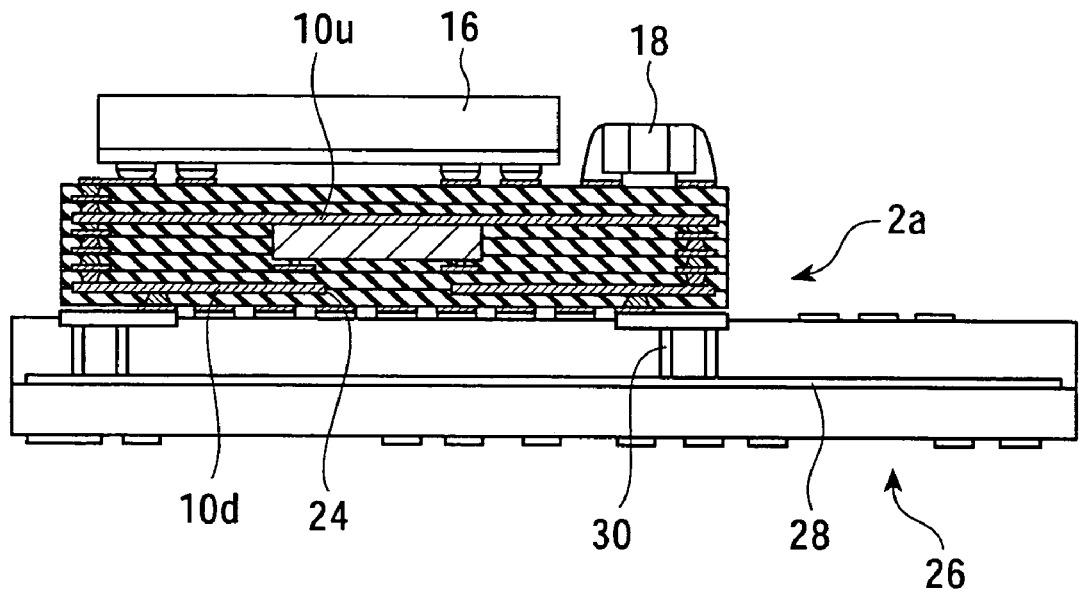
FIG. 3A is a cross-sectional view of a circuit module according to a second embodiment of the present invention, FIG. 3B being a perspective view of a shield cage in a wiring board included in the circuit module, the shield cage being shown upside down.
Figure 3B:
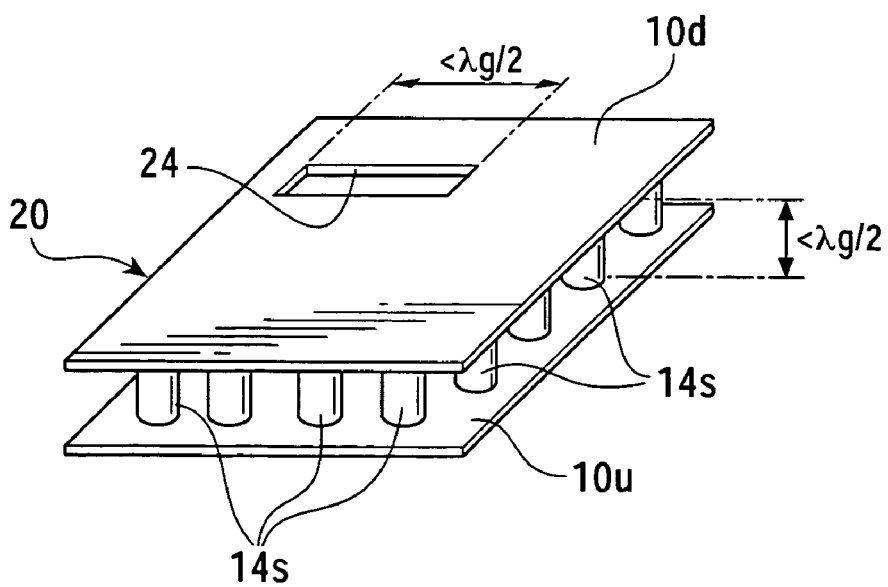

FIGS. 3A and 3B illustrate a circuit module according to a second embodiment of the present invention. Specifically, FIG. 3A is a cross sectional view of the circuit module, and FIG. 3B is a perspective view of a shield cage in a wiring board included in the circuit module, the shield cage being shown upside down. Reference numeral 2a indicates a circuit module according to the present embodiment. The circuit module 2a is analogous to the circuit module 2 shown in FIG. 2, except that a hole 24 is provided in a lower shield wiring film 10d.

When a ground line is provided in the vicinity of an active surface of an IC and the potential thereof affects the characteristics of the IC, the hole 24 serves to prevent the potential from affecting the IC. When the longitudinal side of the hole 24 has a length of $\lambda g/2$ or more, the hole 24 acts as a slit antenna to cause reflection. Thus, it is preferable that the longitudinal side be set to less than $\lambda g/2$.

Reference numeral 26 indicates a printed wiring board, on which the circuit module 2a is mounted. Reference numeral 28 indicates a wiring film that serves as a ground line in the printed wiring board 26. Reference numeral 30 indicates through-holes.

Figure 1:
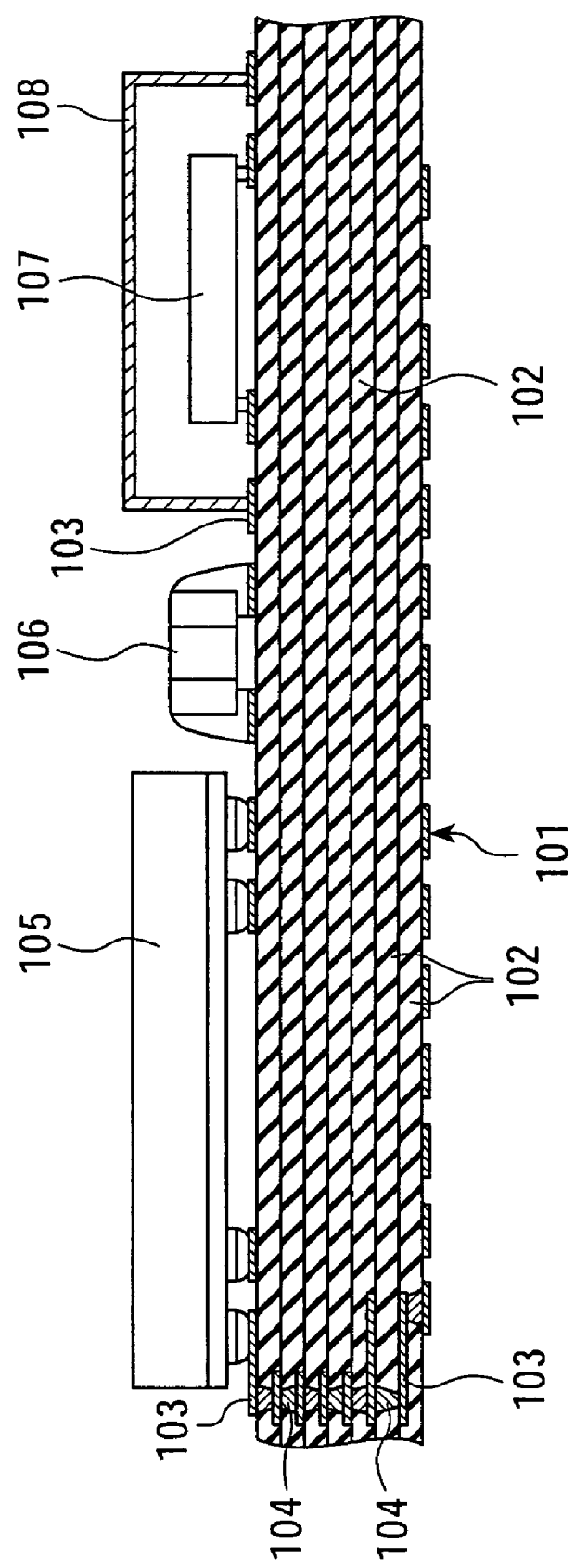
FIG. 1 is cross-sectional view showing a known example of a circuit module.

The circuit module 2a offers the same advantages as the circuit module 2 shown in FIG. 1. In addition, since the lower shield wiring film 10d has the hole 24 at a portion corresponding to an active portion of the RF-IC 8, the circuit module 2a can eliminate or reduce the influence of the potential of the ground line upon the active portion of the RF-IC 8.

Additionally, setting the diameter or longitudinal side of the hole 24 to less than $\lambda g/2$, as described above, can eliminate the risk that the portion of the hole 24 acts as a slit antenna to cause reflection.

What is claimed is:

1. A wiring board comprising:
    interlayer insulating films;
    multilayer wiring films, each being provided at one of the interlayer insulating films or between two of the interlayer insulating films;
    interlayer-connection conductor films, each extending through at least one of the interlayer insulating films and providing an electrical connection between at least two of the multilayer wiring films;
    at least one semiconductor integrated circuit device;
    a first shield wiring film on which the semiconductor integrated circuit device is directly mounted;
    a second shield wiring film provided so as to oppose the first wiring film with the semiconductor integrated circuit device interposed therebetween; and
    a plurality of shield interlayer-connection conductor films that are provided so as to surround a periphery of the semiconductor integrated circuit device and that provide electrical connections between the first shield wiring film and the second shield wiring film, each shield interlayer-connection conductor film extending through at least one of the interlayer insulating films,
    wherein the first and second shield wiring films have a gap therebetween, the gap being smaller than one half a wavelength $\lambda g$ of an electromagnetic wave to be prevented from radiating, and
    wherein the first and second shield wiring films and the shield interlayer-connection conductor films define a shield cage having a rectangular-parallelepiped inner space with height a, width b, and length c, where $a \leq b \leq c$, and a wavelength $\lambda g$ of an electromagnetic wave to be prevented from radiating satisfies a relationship:

$$\lambda g > 2/[\{1/b)^2 + (1/c)^2\}^{1/2}].$$

2. The wiring board according to claim 1, wherein at least one of the shield wiring films has a hole, a diameter or a longitudinal side of the hole being smaller than one half a wavelength $\lambda g$ of an electromagnetic wave to be prevented from radiating.

3. A circuit module comprising:
    the wiring board according to claim 1
    at least one semiconductor integrated circuit device provided on the wiring board; and
    at least one passive component provided on the wiring board.

4. A circuit module comprising:
the wiring board according to claim 1;
at least one semiconductor integrated circuit device provided on the wiring board; and
at least one passive component provided on the wiring board.

5. A wiring board comprising:
interlayer insulating films;
multilayer wiring films, each being provided at one of the interlayer insulating films or between two of the interlayer insulating films;
interlayer-connection conductor films, each extending through at least one of the interlayer insulating films and providing an electrical connection between at least two of the multilayer wiring films;
at least one semiconductor integrated circuit device;
a first shield wiring film on which the semiconductor integrated circuit device is directly mounted;
a second shield wiring film provided so as to oppose the first wiring film with the semiconductor integrated circuit device interposed therebetween; and
a plurality of shield interlayer-connection conductor films that are provided so as to surround a periphery of the semiconductor integrated circuit device and that provide electrical connections between the first shield wiring film and the second shield wiring film, each shield interlayer-connection conductor film extending through at least one of the interlayer insulating films, wherein the first and second shield wiring films have a gap therebetween, the gap being smaller than one half a wavelength $\lambda g$ of an electromagnetic wave to be prevented from radiating, wherein at least one of the shield wiring films has a hole, a diameter or a longitudinal side of the hole being smaller than one half a wavelength $\lambda g$ of an electromagnetic wave to be prevented from radiating, and wherein the first and second shield wiring films and the shield interlayer-connection conductor films define a shield cage having a rectangular-parallelepiped inner space with height a, width b, and length c, where $a \leq b \leq c$, and a wavelength $\lambda g$ of an electromagnetic wave to be prevented from radiating satisfies a relationship:

$$\lambda g > 2/[\{(1/b)^2 + (1/c)^2\}^{1/2}].$$

6. A circuit module comprising:
the wiring board according to claim 2 or 5;
at least one semiconductor integrated circuit device provided on the wiring board; and
at least one passive component provided on the wiring board.

* * * * *